United States Patent
Xiao et al.

(10) Patent No.: US 11,430,854 B2
(45) Date of Patent: Aug. 30, 2022

(54) ELECTRONIC SUBSTRATE HAVING DETECTION LINES ON SIDE OF SIGNAL INPUT PADS, METHOD OF MANUFACTURING ELECTRONIC SUBSTRATE, AND DISPLAY PANEL HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunsheng Xiao, Beijing (CN); Haigang Qing, Beijing (CN); Xiangdan Dong, Beijing (CN); Tingliang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 16/963,776

(22) PCT Filed: Sep. 30, 2019

(86) PCT No.: PCT/CN2019/109479
§ 371 (c)(1),
(2) Date: Jul. 21, 2020

(87) PCT Pub. No.: WO2021/062640
PCT Pub. Date: Apr. 8, 2021

(65) Prior Publication Data
US 2022/0005913 A1    Jan. 6, 2022

(51) Int. Cl.
*H01L 29/08*    (2006.01)
*H01L 27/32*    (2006.01)
(Continued)

(52) U.S. Cl.
CPC ......... *H01L 27/3276* (2013.01); *G09G 3/006* (2013.01); *H01L 27/3218* (2013.01);
(Continued)

(58) Field of Classification Search
CPC ............. H01L 27/3276; H01L 27/3218; H01L 27/3262; H01L 27/3265; G09G 3/006
(Continued)

(56) References Cited

U.S. PATENT DOCUMENTS

2016/0155409 A1*   6/2016   Jeoung .................. G09G 5/003
345/214
2018/0366529 A1*   12/2018   Lee ...................... H01L 27/3262
(Continued)

*Primary Examiner* — Phuc T Dang (57) ABSTRACT

An electronic substrate, a method of manufacturing an electronic substrate, and a display panel are provided. The electronic substrate includes a base substrate, and the base substrate includes a display area and a peripheral area. The electronic substrate further includes sub-pixels and data lines in the display area, and a plurality of signal input pads, a plurality of first detection lines, and a plurality of second detection lines in the peripheral area. The first detection lines and the second detection lines are on a side of the signal input pads away from the display area, and are electrically connected to the signal input pads. The first detection lines are made of a non-metallic conductive material, the second detection lines are made of a metal conductive material, and at least one of the plurality of first detection lines is provided between every two adjacent second detection lines.

20 Claims, 6 Drawing Sheets

(51) Int. Cl.
 *G09G 3/00* (2006.01)
 *H01L 51/56* (2006.01)
(52) U.S. Cl.
 CPC ...... *H01L 27/3262* (2013.01); *H01L 27/3265* (2013.01); *H01L 51/56* (2013.01); *H01L 2227/323* (2013.01)
(58) Field of Classification Search
 USPC .......................................................... 257/40
 See application file for complete search history.

(56) References Cited

U.S. PATENT DOCUMENTS

2019/0171318 A1* 6/2019 Ryu ...................... G06F 3/0446
2020/0090566 A1* 3/2020 Lee ........................ G09G 3/006

\* cited by examiner

ELECTRONIC SUBSTRATE HAVING DETECTION LINES ON SIDE OF SIGNAL INPUT PADS, METHOD OF MANUFACTURING ELECTRONIC SUBSTRATE, AND DISPLAY PANEL HAVING THE SAME

TECHNICAL FIELD

Embodiments of the present disclosure relate to an electronic substrate, a method of manufacturing an electronic substrate, and a display panel.

BACKGROUND

In recent years, the flat panel display technology has become the mainstream of display technologies, which enriches and facilitates people's life. For example, organic light-emitting diode (OLED) display panels have broad prospects for development owing to the advantages of self-luminescence, high contrast, low energy consumption, wide viewing angle, fast response speed, applicability in flexible panels, wide usage temperature range, simple manufacturing process, etc. How to optimize the manufacturing process of display panels becomes an issue to be concerned in the field.

SUMMARY

At least one embodiment of the present disclosure provides an electronic substrate, the electronic substrate comprises a base substrate, and the base substrate comprises a display area and a peripheral area outside the display area. The electronic substrate further comprises a plurality of sub-pixels and a plurality of data lines in the display area, and a plurality of signal input pads, a plurality of first detection lines, and a plurality of second detection lines in the peripheral area. The plurality of data lines are configured to provide data signals for the plurality of sub-pixels; the plurality of signal input pads are electrically connected to the plurality of data lines; and the plurality of first detection lines and the plurality of second detection lines are on a side of the plurality of signal input pads away from the display area, and are electrically connected to the plurality of signal input pads. The plurality of first detection lines are made of a non-metallic conductive material, the plurality of second detection lines are made of a metal conductive material, and at least one of the plurality of first detection lines is provided between every two adjacent second detection lines; and the electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

In some examples, a material of the first detection lines is a semiconductor material which is subjected to a conducting treatment.

In some examples, a material of the first detection lines comprises silicon or conductive metal oxide.

In some examples, a material of the first detection lines comprises low-temperature polysilicon.

In some examples, at least one of the plurality of second detection lines comprises a second cutting surface, the second cutting surface is a second part of the cutting surface of the electronic substrate, and the second cutting surface is a cutting surface of the metal conductive material.

In some examples, the base substrate comprises a third cutting surface, the third cutting surface is a third part of the cutting surface of the electronic substrate, and the third cutting surface is on a side of the plurality of first detection lines and the plurality of second detection lines away from the display area, and is flush with the first cutting surface and the second cutting surface.

In some examples, at least one of the plurality of sub-pixels comprises a transistor and a storage capacitor; the transistor comprises an active layer, a first gate insulating layer, a gate electrode, a second gate insulating layer, an interlayer insulating layer, and a source-drain electrode layer which are sequentially stacked on the base substrate, and the active layer is on a side of the gate electrode close to the base substrate; and the storage capacitor comprises a first capacitor electrode and a second capacitor electrode, the first capacitor electrode and the gate electrode are in a same layer, and the second capacitor electrode is between the second gate insulating layer and the interlayer insulating layer.

In some examples, the first detection lines and the active layer are in a same layer.

In some examples, the second detection lines and the first capacitor electrode are in a same layer, or the second detection lines and the second capacitor electrode are in a same layer.

In some examples, the plurality of signal input pads and the source-drain electrode layer are in a same layer.

In some examples, orthographic projections of the first detection lines on the base substrate and orthographic projections of the second detection lines on the base substrate are alternately arranged one by one.

At least one embodiment of the present disclosure further provides a display panel, and the display panel comprises the electronic substrate described above.

At least one embodiment of the present disclosure further provides a method of manufacturing an electronic substrate, and the method comprises: forming a plurality of sub-pixels and a plurality of data lines in a display area on a base substrate, the plurality of data lines being configured to provide data signals for the plurality of sub-pixels; forming a plurality of signal input pads in a peripheral area outside the display area on the base substrate, the plurality of signal input pads being electrically connected to the plurality of data lines; and forming a plurality of first detection lines and a plurality of second detection lines in the peripheral area, the plurality of first detection lines and the plurality of second detection lines being on a side of the plurality of signal input pads away from the display area and being electrically connected to the plurality of signal input pads. The plurality of first detection lines are made of a non-metallic conductive material, the plurality of second detection lines are made of a metal conductive material, and at least one of the plurality of first detection lines is provided between every two adjacent second detection lines; and the electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

In some examples, the method further comprises: providing a detection circuit in a detection area outside the display area and the peripheral area, in which the plurality of first detection lines and the plurality of second detection lines extend to the detection area to be electrically connected to the detection circuit; and detecting the plurality of data lines through the detection circuit, the plurality of first detection lines, and the plurality of second detection lines.

In some examples, the method further comprises: cutting the first detection lines and the second detection lines to separate the detection area from the peripheral area and the display area and to form the first cutting surface.

In some examples, the first detection lines and the second detection lines are cut to form a second cutting surface of at least one of the second detection lines, and the second cutting surface is a cutting surface of the metal conductive material.

In some examples, forming the plurality of first detection lines comprises: forming a semiconductor material layer, and performing a patterning process and a conducting treatment on the semiconductor material layer, so as to form the plurality of first detection lines.

In some examples, a material of the semiconductor material layer comprises silicon or conductive metal oxide.

In some examples, forming at least one of the plurality of sub-pixels comprises forming a transistor and a storage capacitor, and forming the transistor and the storage capacitor comprises: sequentially forming an active layer, a first gate insulating layer, a gate electrode, a second gate insulating layer, a interlayer insulating layer, and a source-drain electrode layer on the base substrate; and forming a first capacitor electrode of the storage capacitor in a same patterning process as the gate electrode, and forming a second capacitor electrode of the storage capacitor between the second gate insulating layer and the interlayer insulating layer.

In some examples, the plurality of first detection lines and the active layer are formed in a same patterning process.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In the following, the technical solutions in the embodiments of the present disclosure are clearly and completely described with reference to the non-limitative exemplary embodiments illustrated in the drawings and described in details in the following description, and the exemplary embodiments of the present disclosure and various features thereof and advantageous details are more fully explained. It should be noted that the features illustrated in the figures are not necessarily drawn to scale. The present disclosure omits descriptions of known materials, components, and process techniques so as not to obscure the exemplary embodiments of the present disclosure. The described examples are only intended to facilitate understanding of the implementation of the exemplary embodiments of the present disclosure and further enable those skilled in the art to implement the exemplary embodiments. Therefore, these examples should not be understood as limiting the scope of the embodiments of the present disclosure.

Unless otherwise specifically defined, technical terms or scientific terms used in the present disclosure shall have the ordinary meaning understood by those with ordinary skills in the art to which the present disclosure belongs. As used in the present disclosure, "first", "second" and similar words do not indicate any order, quantity or importance, but are only used to distinguish different components. Furthermore, in various embodiments of the present disclosure, the same or similar reference numerals refer to the same or similar components.

In the manufacturing process of a display panel, it is necessary to perform defect detection on the signal line that is formed, for example, to detect whether there is a short circuit or an open circuit on the signal line. For example, in the manufacturing process of a display panel, a detection area is formed outside the panel area of the substrate, and the detection circuit in the detection area is electrically connected to the signal line in the panel area through a detection line to detect the signal line and timely repair the defect of the substrate. After the detection is completed, the detection area is cut off to form a panel.

The inventor of the present disclosure found that because of the relatively dense distribution and small line spacing of the detection lines, during the cutting process, the cutting may cause metal debris in the detection lines to splash, which may lead to a short circuit between adjacent detection lines. For example, in the case where laser cutting is performed, the laser may cause the metal wire to melt and generate splashed metal debris, thereby causing a short circuit between adjacent detection lines. Because the detection lines are electrically connected to the signal lines of the display area, the short circuit between the detection lines may cause a short circuit between the signal lines, thereby resulting in poor display.

The embodiments of the present disclosure provide an electronic substrate in which the above detection line or a part of the detection line is formed by adopting a non-metallic conductive material, so as to avoid a short circuit between adjacent detection lines resulting from metal debris during the cutting process.

Figure 1:
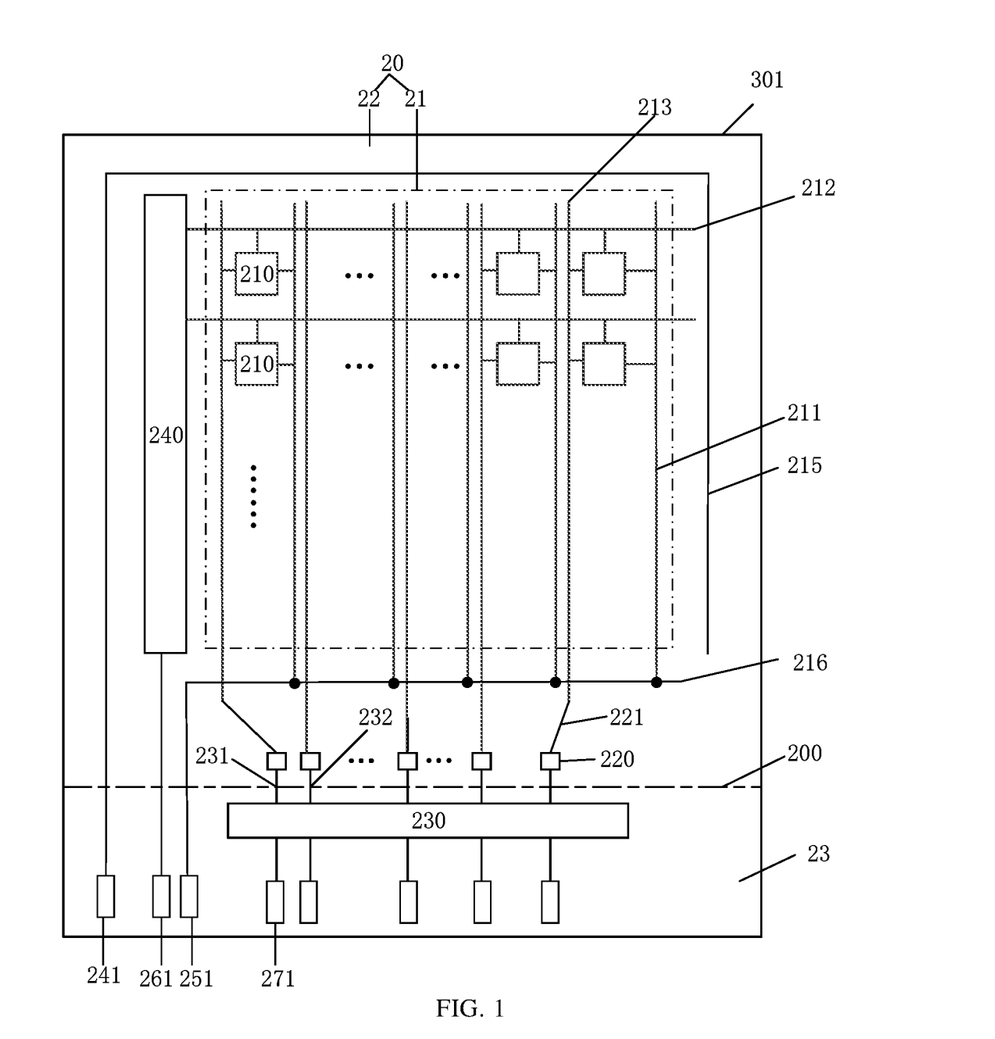
FIG. 1 is a first schematic plane view of an electronic substrate provided by some embodiments of the present disclosure.

FIG. 1 is a first schematic plane view of an electronic substrate provided by an embodiment of the present disclosure. For example, the electronic substrate is an electronic substrate (for example, an array substrate) used in a display panel, and the embodiments of the present disclosure are not limited thereto.

FIG. 1 illustrates the electronic substrate during the detection process. As illustrated in FIG. 1, a base substrate 301 comprises a display area 21, a peripheral area (non-display area) 22 outside the display area 21, and a detection area 23. The detection area 23 is located on a side of the peripheral area 22 away from the display area 21, the display area 21 and the peripheral area 22 correspond to an electronic substrate 20, and the detection area 23 is cut off along a cutting line 200 on a side of the peripheral area 22 away from the display area 21 after the detection is completed, so as to form the electronic substrate 20.

The display area 21 comprises at least one signal line, and the signal line may be a power line, a gate line, a data line, or the like. As illustrated in FIG. 1, the display area 21 comprises a plurality of gate lines 212, a plurality of data lines 213, and a plurality of sub-pixels 210 arranged in an array. The gate line is configured to provide gate signals for the plurality of sub-pixels 210, and the data line is configured to provide data signals for the plurality of sub-pixels 210.

For example, the electronic substrate is an array substrate applied to an organic light-emitting diode (OLED) display panel. In some other examples, the electronic substrate may also be an array substrate applied to a liquid crystal display panel or a quantum dot light-emitting diode display panel, and the embodiments of the present disclosure are not limited thereto.

Each of the sub-pixels 210 comprises a light-emitting element (OLED) and a pixel circuit that is configured to drive the light-emitting element to emit light, and the pixel circuit is electrically connected to the corresponding gate line 212 and data line 213, respectively. For example, the pixel circuit comprises a conventional 2T1C (that is, two transistors and a capacitor) pixel circuit, 4T2C, 5T1C, 7T1C or other nTmC (n and m are positive integers) pixel circuits. Moreover, in different embodiments, the pixel circuit can further comprise a compensation circuit which comprises an internal compensation circuit or an external compensation circuit. The compensation circuit may comprise a transistor, a capacitor, and the like. For example, according to requirements, the pixel circuit may further comprise a reset circuit, a light-emitting control circuit, a detection circuit, and the like.

As illustrated in FIG. 1, the electronic substrate 20 further comprises a gate driving circuit 240 located in the peripheral area 22. The gate driving circuit 240 is, for example, a gate on array (GOA) structure. The gate driving circuit 240 is connected to the gate line 212, and is configured to provide gate driving signals for the sub-pixels 210 in the display area 21 through the gate line 212.

The electronic substrate 20 may further comprise a first power line 211 and a second power line 215 which are configured to provide a first power voltage and a second power voltage for the sub-pixel 210, respectively. As illustrated in FIG. 1, the first power line 211 is located in the display area 21; and the second power line 215 is located in the peripheral area 22, and the second power line 215 may surround the display area 21 in a U-shaped structure. For example, the first power line 211 is configured to provide a high-level power voltage VDD, and the second power line 215 is configured to provide a low-level power voltage VSS. FIG. 1 also illustrates a power bus line 216 connected to the plurality of first power lines 211.

The detection area 23 comprises a detection circuit, and the detection circuit is connected to the signal lines or circuits in the display area 21 and the peripheral area 22 through detection lines, so as to perform defect detection (for example, to detect a short circuit or an open circuit on the signal lines), thereby timely detecting the electronic substrate in the case where a defect is observed. For example, the detection circuit 230 comprises a shorting bar, a switching element, and the like.

FIG. 1 exemplarily illustrates a data line detection circuit 230 in the detection area 23, and the data line detection circuit 230 is configured to be electrically connected to the data lines 213, so as to detect the data lines 213. The electronic substrate 20 further comprises a plurality of first detection lines 231 and a plurality of second detection lines 232. The first detection lines 231 and the second detection lines 232 are located in the peripheral area 22, one end of the first detection line 231 or the second detection line 232 is electrically connected to the data line 213, and the other end of the first detection line 231 or the second detection line 232 extends to the detection area 23 to be electrically connected to the data line detection circuit 230, so that the data line 213 is electrically connected to the data line detection circuit 230. The technical solutions provided by the embodiments of the present disclosure are exemplarily described below by taking the first detection lines and the second detection lines for detecting the data lines as an example, which is not intended to limit the present disclosure, and the technical solutions provided by the embodiments of the present disclosure are also applicable to other detection lines.

The data line 213 may be electrically connected to the detection line directly, or may be electrically connected to the detection line through other structures. FIG. 1 illustrates an example in which the data line 213 is connected to the detection line through a signal input pad. As illustrated in FIG. 1, the electronic substrate 20 further comprises a plurality of signal input pads 220 located in the peripheral area 22. The plurality of signal input pads 220 are located on a side of the plurality of detection lines close to the display area 21, and are electrically connected to the plurality of data lines 213 and the plurality of detection lines, respectively. For example, the signal input pad 220 is a bonding pad for bonding to an external circuit (such as an IC circuit board), so as to receive a data driving signal.

For example, the plurality of signal input pads 220 are electrically connected to the plurality of data lines 213 in a one-to-one correspondence. As illustrated in FIG. 1, the plurality of data lines 213 are electrically connected to the plurality of signal input pads 220 in a one-to-one correspondence through a plurality of data line lead-out lines 221. In some other examples, the plurality of data lines may also be electrically connected to the plurality of signal input pads 220 through a multiplexing circuit (MUX), so as to reduce the number and distribution density of the signal input pads 220; and one signal input pad 220 is correspondingly connected to a plurality of (for example, two or three) data lines 213.

For example, the plurality of signal input pads 220 are electrically connected to the plurality of detection lines (comprising the first detection lines 231 and the second detection lines 232) in a one-to-one correspondence.

FIG. 1 further exemplarily illustrates detection electrodes 241, 261, 251, and 271 which are electrically connected to the second power line 215, the gate driving circuit 240, the power bus line 216, and the data line detection circuit 230, respectively. After the detection and repair are completed, cutting is performed along the cutting line 200 between the detection area 23 and the peripheral area 22 to separate the detection area 23 from the peripheral area 22, so as to remove the detection area 23, thereby obtaining the electronic substrate 20 illustrated in FIG. 2. In the electronic substrate 20, the first detection line 231 and the second detection line 232 are cut together with the base substrate of the electronic substrate, and thus one end of the first detection line 231 and the second detection line 232 is flush with an edge (i.e., the cutting position) of the electronic substrate 20. That is, at the position of the cutting line 200, i.e., on the side of the first detection line 231 and the second detection line 232 away from the display area 21, the first detection line 231 comprises a first cutting surface, the second detection line 232 comprises a second cutting surface, and the base substrate 301 comprises a third cutting surface. The first cutting surface, the second cutting surface and the third cutting surface are all parts of the cutting surface of the electronic substrate, and the first cutting surface and the second cutting surface are both flush with the third cutting surface of the base substrate 301. Reference may be made to the following descriptions about FIG. 4A and FIG. 4B.

For example, a material of the first detection line 231 is a semiconductor material which is subjected to a conducting treatment, for example, a doped semiconductor material.

For example, the material of the first detection line 231 comprises silicon (e.g., low-temperature polysilicon) or conductive metal oxide.

For example, the material of the first detection line 231 comprises a conductive material which is obtained by performing the conducting treatment on the metal oxide semiconductor material, such as heavily doped indium tin oxide (IGZO), indium zinc oxide (IZO), zinc oxide (ZnO), zinc aluminum oxide (AZO), and the like.

For example, the first detection line 231 may be formed in the same layer as the active layer of a certain transistor in the pixel of the display area in the same patterning process, thereby saving process cost. In different embodiments, the transistor may be a switching transistor, a driving transistor, or the like in the pixel circuit.

For example, a material of the second detection line 232 is a metal conductive material, which may comprise, for example, gold (Au), silver (Ag), copper (Cu), aluminum (Al), molybdenum (Mo), magnesium (Mg), tungsten (W), titanium (Ti) and alloy materials composed of the above metals.

Figure 2:
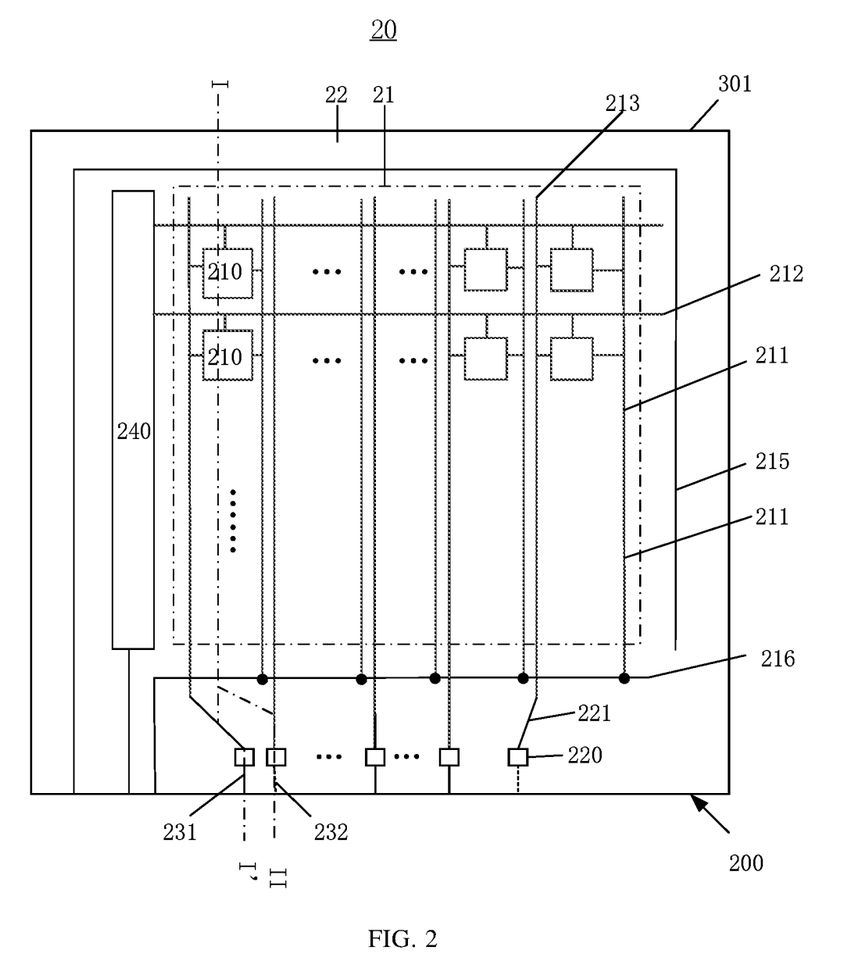
FIG. 2 is a second schematic plane view of an electronic substrate provided by some embodiments of the present disclosure.

The plurality of first detection lines 231 are made of a non-metallic conductive material, the plurality of second detection lines 232 are made of a metal conductive material, and at least one first detection line 213 is provided between every two adjacent second detection lines 232. For example, the plurality of first detection lines 231 and the plurality of second detection lines 232 are alternately arranged one by one in a direction parallel to the surface of the electronic substrate, and orthographic projections of the first detection lines 231 on the base substrate 301 and orthographic projections of the second detection lines 232 on the base substrate 301 are alternately arranged one by one (referring to FIG. 4A and FIG. 4B below). For example, as illustrated in FIG. 2, the plurality of data lines 213 in the display area 21 are electrically connected to the first detection lines 231 and the second detection lines 232 alternately through the data line lead-out lines 221.

In some other examples, a plurality of first detection lines 231 may also be provided between two adjacent second detection lines 232 to further increase the distance between metal wires, so as to reduce the risk of a short circuit. The embodiments of the present disclosure are not limited thereto.

Because at least one first detection line 231 made of the non-metallic material is provided between every two adjacent second detection lines 232, even if the material of the second detection lines 232 is metal, the spacing between adjacent second detection lines 232 is larger compared with the spacing between the first detection line 231 and the second detection line 232, that is, compared with the case where both the first detection lines 231 and the second detection lines 232 are made of metal materials, the spacing between adjacent metal lines is lager, thereby effectively reducing the risk of a short circuit during cutting. For example, the first detection line 231 and the second detection line 232 may be located in different layers, which increases the distance between the first detection line 231 and the second detection line 232, and further reduces the risk of a short circuit during cutting.

As described above, by arranging the detection lines in different layers, the distribution density of the detection lines can be reduced and the spacing between the detection lines can be increased, thereby further reducing the risk of a short circuit. For example, by reducing the distribution density of the detection lines, the area occupied by the detection lines on the substrate can be further saved, which is beneficial to wiring.

Figure 3A:
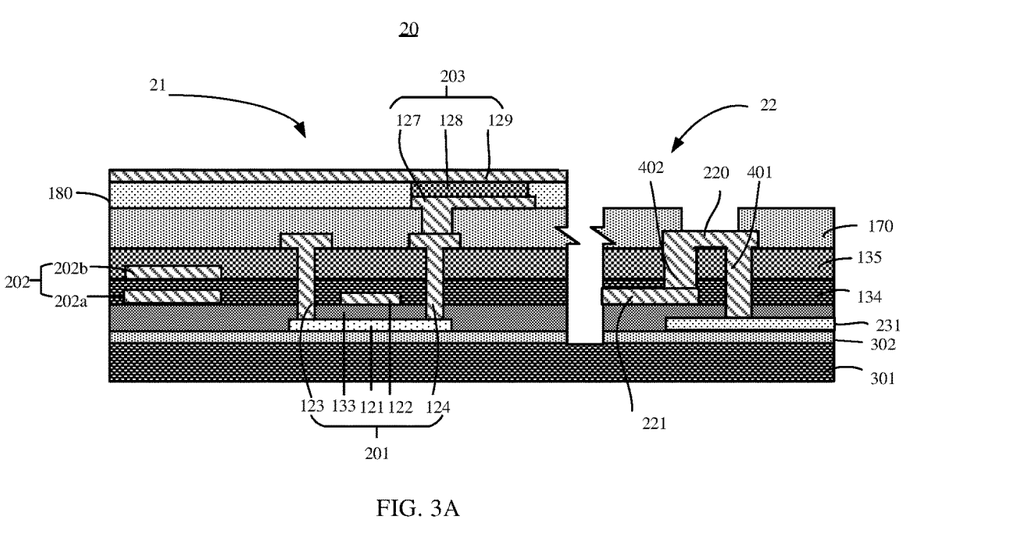
FIG. 3A is a first cross-sectional view of an electronic substrate provided by some embodiments of the present disclosure.
Figure 3B:
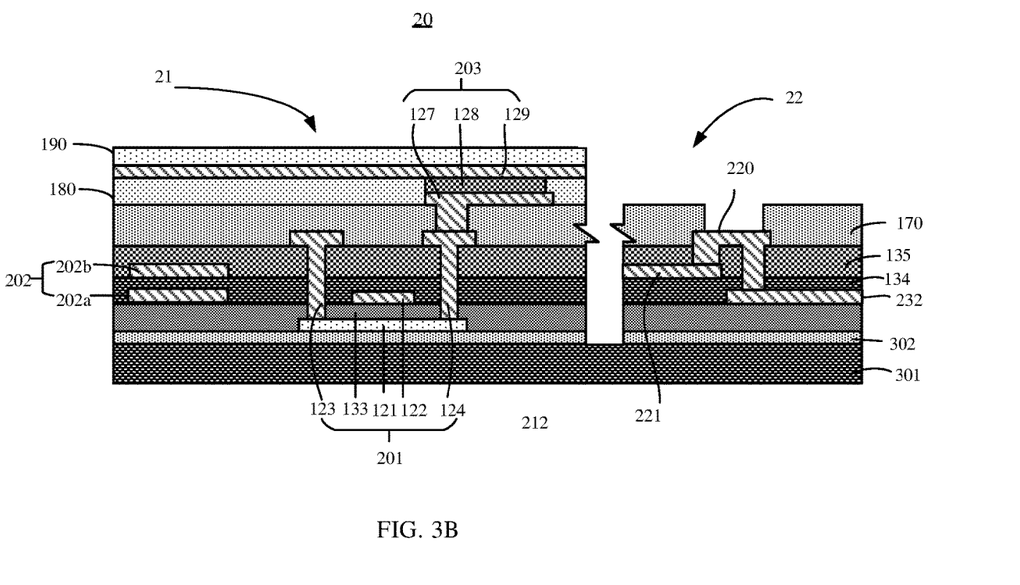
FIG. 3B is a second cross-sectional view of an electronic substrate provided by some embodiments of the present disclosure.
Figure 4A:
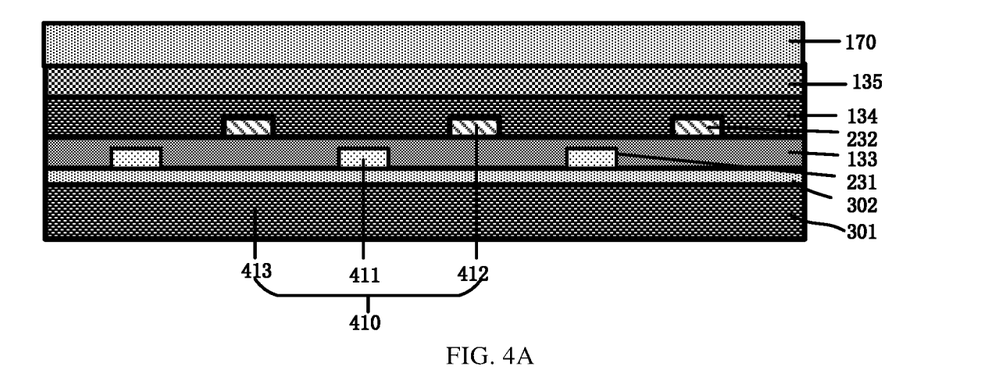
FIG. 4A is a third cross-sectional view of an electronic substrate provided by some embodiments of the present disclosure.
Figure 4B:
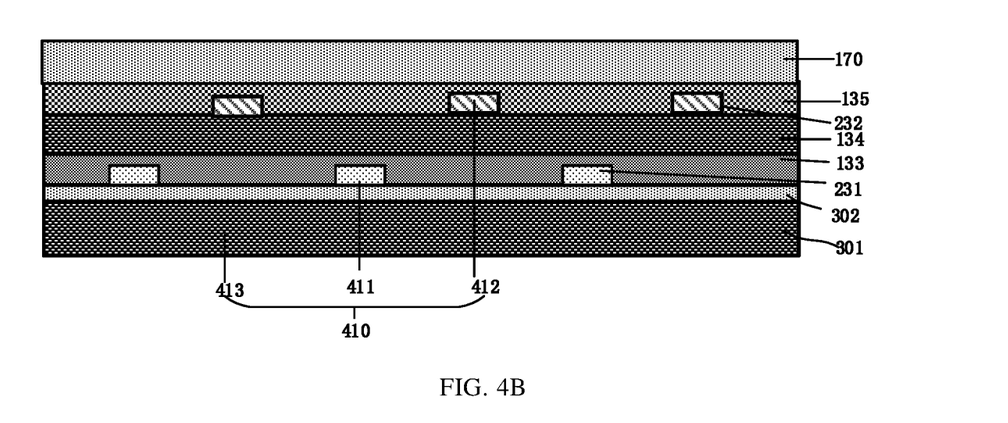
FIG. 4B is a fourth cross-sectional view of an electronic substrate provided by some embodiments of the present disclosure.

FIG. 3A and FIG. 3B illustrate cross-sectional views of FIG. 2 along section lines I-I' and I-II, respectively, and FIG. 4A and FIG. 4B illustrate different examples of cross-sectional views of the electronic substrate illustrated in FIG. 1 along the direction of the cutting line 200, i.e., the schematic view of the side surface (cutting surface) of the electronic substrate illustrated in FIG. 2. Taking the case where the electronic substrate is an organic light-emitting diode display substrate as an example, the electronic substrate provided by the embodiments of the present disclosure is exemplarily described below with reference to FIGS. 2, 3A-3B, and 4A-4B.

Each pixel 210 in the display area comprises at least one light-emitting element (for example, an organic light-emitting diode) 203 and a pixel circuit connected thereto. The light-emitting element is driven by the pixel circuit to emit light. For example, the pixel circuit comprises a conventional OLED pixel driving circuit, for example, including a switching transistor, a driving transistor, a storage capacitor, and the like, or may further comprise a reset transistor, a light-emitting control transistor, and the like. The embodiments of the present disclosure do not limit the specific structure of the pixel circuit.

For the sake of clarity, FIG. 3A only illustrates a transistor 201 and a storage capacitor 202 directly connected to the light-emitting element in the pixel circuit. For example, the transistor 201 may be a driving transistor which is configured to work in a saturated state and control the amount of a current that drives the light-emitting element 203 to emit light. For example, the transistor 201 may also be a light-emitting control transistor for controlling whether a current that drives the light-emitting element 203 to emit light can pass through. The embodiments of the present disclosure are not limited in this aspect.

As illustrated in FIG. 3A, the transistor 201, the storage capacitor 202, and the light-emitting element 203 are located on the base substrate 301. For example, the base substrate 301 is a flexible substrate, and the material of the flexible substrate is, for example, polyimide (PI), polyethylene terephthalate (PET), polycarbonate, polyethylene, polyacrylate, polyetherimide, polyethersulfone, or the like.

For example, the electronic substrate may further comprise a buffer layer 302 disposed between the base substrate 301 and the pixel circuit. The buffer layer 302 can prevent moisture and/or oxygen from penetrating through the base substrate 301 into the pixel circuit to cause corrosion, and can also, for example, help provide a flat surface for forming the pixel circuit. For example, the material of the buffer layer 302 may be silicon nitride, silicon oxide, or oxynitride of silicon. For example, the buffer layer may also comprise a structure in which silicon oxide layers and silicon nitride layers are alternately stacked.

As illustrated in FIG. 3A, the transistor 201 comprises an active layer 121, a gate electrode 122, a first gate insulating layer 133, and a source-drain electrode layer (comprising a source electrode 123 and a drain electrode 124). For example, the active layer 121 comprises a channel region, and a source region and a drain region located on opposite sides of the channel region. The storage capacitor 202 comprises a first capacitor electrode 202a, a second gate insulating layer 134, and a second capacitor electrode 202b. For example, the first capacitor electrode 202a of the storage capacitor 202 and the gate electrode 122 of the transistor 201 are provided in the same layer.

It should be noted that "provided in the same layer" in the embodiments of the present disclosure means that a plurality of layer structures are formed by the same material layer through the same process or different processes, and are not necessarily located on the same horizontal plane or having the same height or thickness.

It should also be noted that the source electrode and the drain electrode of the transistor adopted herein can be symmetrical in structure. Therefore, the source electrode and the drain electrode can be indistinguishable in structure, and the source electrode and the drain electrode can be interchanged as needed.

In FIG. 3A, the transistor 201 is of a top-gate type, but the specific types of the transistor are not limited in the embodiments of the present disclosure. In addition to the top-gate type, the transistor may also be of a bottom-gate type or a double-gate type. Besides, when the transistors are of different types, the stacked structures on the base substrate are also adjusted accordingly to be different from each other.

For example, the transistor 201 is, for example, a thin film transistor, and the active layer 121 may be amorphous silicon, polycrystalline silicon (such as low-temperature polycrystalline silicon or high-temperature polycrystalline silicon), an oxide semiconductor (such as IGZO), or the like, and the transistor 201 may be of an N-type or a P-type.

The light-emitting element 203 comprises a first electrode 127, a second electrode 129, and a light-emitting layer 128 disposed between the first electrode 127 and the second electrode 129. The first electrode 127 is electrically connected to the drain electrode 124 of the transistor 201. Here, the first electrode 127 is a pixel electrode, and the second electrode 129 is a common electrode. One of the first electrode 127 and the second electrode 129 is an anode, and the other is a cathode. For example, the first electrode 127 is an anode, and the second electrode 129 is a cathode. For example, in at least one example, the light-emitting element 203 may further comprise at least one of a hole injection layer, a hole transport layer, an electron injection layer, or an electron transport layer in addition to the light-emitting layer 128.

For example, the light-emitting element 203 may have a top emission structure, a bottom emission structure, or a double-sided emission structure. For example, the light-emitting element 203 has a top emission structure, the first electrode 127 has reflectivity, and the second electrode 129 has transmissivity or semi-transmissivity. For example, the first electrode 127 is made of a transparent conductive oxide material such as indium tin oxide (ITO). For example, the first electrode 127 is made of a material with high work function to serve as an anode, such as an ITO/Ag/ITO stacked structure; and the second electrode 129 is made of a material with low work function to serve as a cathode, such as a semi-transmissive metal or metal alloy material, for example, Ag/Mg alloy material.

Figure 7:
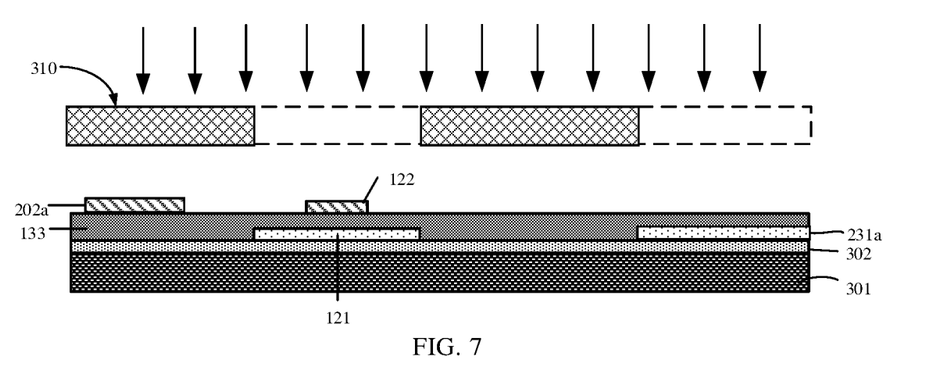
FIG. 7 is a schematic diagram of a method of manufacturing an electronic substrate provided by some embodiments of the present disclosure.

For example, as illustrated in FIG. 3A, the first detection line 231 and the active layer 121 of the transistor 201 are located in the same layer, and both of them may be formed by the same semiconductor material layer through the same patterning process. For example, after the semiconductor material layer undergoes a patterning process, at least a part of the semiconductor material layer corresponding to the first detection line is subjected to a conducting treatment, so as to form the first detection line. For example, in the case where the semiconductor material layer is polysilicon, for example, while doping the source region and the drain region of the active layer of the transistor, the semiconductor pattern corresponding to the first detection line may be subjected to a conducting treatment (as illustrated in FIG. 7). For example, in the case where the semiconductor material layer is amorphous silicon or oxide semiconductor, the part corresponding to the first detection line can be subjected to a conducting treatment separately, such as laser annealing, ion doping, plasma surface treatment, and the like.

For example, the signal input pad 220 is provided in the same layer as the conductive layer of the topmost layer (farthest from the base substrate 301) below the light-emitting element in the display area 21, so as to facilitate the subsequent bonding process. For example, as illustrated in FIG. 3A and FIG. 3B, the signal input pad 220 and the source-drain electrode layer of the transistor 201 are located in the same layer, and both of them can be formed of the same conductive material by the same patterning process.

For example, the second detection line 232 may also be provided in the same layer as the conductive layer in the display area 21, so as to simplify the process. For example, as illustrated in FIG. 3B and FIG. 4A, the second detection line 232 is provided in the same layer as the gate electrode 122 of the transistor 201 and the first capacitor electrode 202a of the storage capacitor 202.

In the electronic substrate provided by at least one embodiment of the present disclosure, the material of the first detection line 231 is a non-metallic conductive material, which increases the spacing between adjacent metal detection lines and effectively reduces the risk of a short circuit, compared with the case where both the first detection line 231 and the second detection line 232 are made of metal conductor materials.

In some other examples, as illustrated in FIG. 4B, the second detection line 232 is provided in the same layer as the second capacitor electrode 202b of the storage capacitor 202. The layer where the second capacitor electrode 202b is located is farther away from the layer where the first detection line 231 is located than the layer where the gate electrode 122 is located, that is, in this way, the spacing between the first detection line 231 and the second detection line 232 is increased, and the risk of a short circuit is further reduced.

In still some other examples, the detection lines may also be distributed in three or more layers, thereby further reducing the distribution density of the detection lines and reducing the risk of a short circuit.

FIG. 4A and FIG. 4B illustrate a first cutting surface 411 of the first detection line 231, a second cutting surface 412 of the second detection line 232, and a third cutting surface 413 of the base substrate 301, all of which are parts of a cutting surface 410 of the electronic substrate 20. For example, both the first cutting surface 411 and the second cutting surface 412 are perpendicular to the base substrate 301.

The first cutting surface 411 is a cutting surface of the non-metallic conductive material, and the second cutting surface 412 is a cutting surface of the metal conductive material.

For example, the data line lead-out lines 221 may also be distributed in multiple layers to reduce the distribution density, thereby reducing the risk of a short circuit. Referring to FIG. 3A and FIG. 3B, a plurality of data line lead-out lines 221 may be distributed in the conductive layer where the gate electrode 122 is located and the conductive layer where the second capacitor electrode 202b is located. For example, in a direction parallel to the surface of the electronic substrate, the data line lead-out lines 221 are provided in the same layer as the gate electrode 122 and the second capacitor electrode 202b, alternately.

For example, the electronic substrate 20 further comprises an interlayer insulating layer 135 provided on the first detection line 231 and the second detection line 232. As illustrated in FIG. 3A, the signal input pad 220 is electrically connected to the first detection line 231 through a first via hole 401 penetrating the first gate insulating layer 133, the second gate insulating layer 134, and the interlayer insulating layer 135, and is electrically connected to the data line lead-out line 221 through a second via hole 402 penetrating the second gate insulating layer 134 and the interlayer insulating layer 135.

For example, the material of the interlayer insulating layer 135 is an inorganic insulating material, which is denser than the organic insulating material, and can effectively prevent the first detection line 231 and the second detection line 232 from being corroded due to air penetration. For example, the material of the interlayer insulating layer 135 is oxide of silicon, nitride of silicon, or oxynitride of silicon, or is a metal oxynitride insulating material such as aluminum oxide, titanium nitride or the like.

For example, the electronic substrate 20 further comprises a planarization layer 170 disposed on the source-drain electrode layer of the transistor 20, and the planarization layer 170 provides a substantially flat surface for the formation of the light-emitting element 203. For example, the planarization layer 170 is made of an organic insulating material, and may comprise organic insulating materials such as polyimide (PI), acrylate, epoxy resin, polymethyl methacrylate (PMMA), and the like.

As illustrated in FIG. 3A, the first electrode 127 of the light-emitting element 203 is electrically connected to the drain electrode 124 of the transistor 201 through a via hole in the planarization layer 170. In the peripheral area 22, the planarization layer 170 exposes the signal input pad 220 to facilitate bonding of the signal input pad 220 to an external circuit (such as a flexible circuit board).

For example, a pixel defining layer 180 is provided above the planarization layer 170 and the first electrode 127, the pixel defining layer 180 forms an opening at a position corresponding to the first electrode 127 to at least partially expose the first electrode 127, and the light-emitting layer 128 is formed in the opening. The second electrode 129 is formed on the light-emitting layer 128 and the pixel defining layer 180.

For example, the material of the planarization layer 170 and the pixel defining layer 180 is an organic material or an inorganic material, and for example, the organic material is resin such as polyimide (PI).

Figure 5:
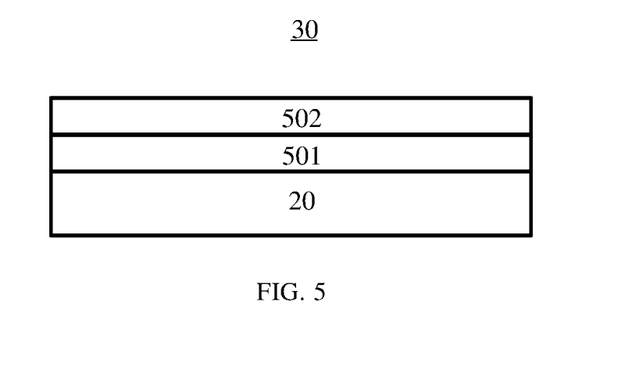
FIG. 5 is a schematic diagram of an electronic substrate provided by some embodiments of the present disclosure.

As illustrated in FIG. 5, at least one embodiment of the present disclosure further provides a display panel 30, which comprises the electronic substrate 20 described above.

For example, the display panel is an OLED display panel, and accordingly the electronic substrate 20 comprised is an OLED substrate. For example, the display panel 30 further comprises an encapsulation layer 501 and a cover plate 502 provided on the electronic substrate 20. The encapsulation layer 501 is configured to seal the light-emitting element 203 to prevent external moisture and oxygen from penetrating into the light-emitting element and the driving circuit, so as to avoid the damage caused to the device. For example, the encapsulation layer 501 comprises an organic thin film or a structure where organic thin films and inorganic thin films are alternately stacked. For example, a water-absorbing layer (not illustrated) may also be provided between the encapsulation layer 501 and the electronic substrate 20, and the water-absorbing layer is configured to absorb water vapor or sol remaining in the light-emitting element 203 during the previous manufacturing process. The cover plate 502 is, for example, a glass cover plate. For example, the cover plate 502 and the encapsulation layer 501 may be an integrated structure.

At least one embodiment of the present disclosure further provides a display device, which comprises the above electronic substrate or the above display panel. The display device may be, for example, any product or component having a display function such as a digital photo frame, a smart bracelet, a smart watch, a mobile phone, a tablet computer, a display, a laptop, a navigator, or the like.

At least one embodiment of the present disclosure further provides a method of manufacturing the above electronic substrate. The method at least comprises: forming a plurality of sub-pixels and a plurality of data lines in a display area on a base substrate, the plurality of data lines being configured to provide data signals for the plurality of sub-pixels; forming a plurality of signal input pads in a peripheral area outside the display area of the base substrate, the plurality of signal input pads being connected to the plurality of data lines; and forming a plurality of first detection lines and a plurality of second detection lines in the peripheral area, the plurality of first detection lines and the plurality of second detection lines being located on a side of the plurality of signal input pads away from the display area and being electrically connected to the plurality of signal input pads. The plurality of first detection lines are made of a non-metallic conductive material, the plurality of second detection lines are made of a metal conductive material, and at least one of the plurality of first detection lines is provided between every two adjacent second detection lines. The electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

In some examples, the method further comprises: providing a detection circuit in a detection area outside the display area and the peripheral area, in which the plurality of first detection lines and the plurality of second detection lines also extend to the detection area to be electrically connected to the detection circuit; and detecting the plurality of data lines through the detection circuit, the plurality of first detection lines, and the plurality of second detection lines.

In some examples, the method further comprises: cutting the first detection lines and the second detection lines to separate the detection area from the peripheral area and the display area and to form the first cutting surface.

In some examples, the first detection lines and the second detection lines are cut to form a second cutting surface of at least one of the second detection lines, and the second cutting surface is a cutting surface of the metal conductive material.

In some examples, forming the plurality of first detection lines comprises: forming a semiconductor material layer and performing a patterning process and a conducting treatment on the semiconductor material layer, so as to form the plurality of first detection lines.

In some examples, the material of the semiconductor material layer comprises silicon or conductive metal oxide.

In some examples, forming at least one of the plurality of sub-pixels comprises forming a transistor and a storage capacitor. Forming the transistor and the storage capacitor comprises: sequentially forming an active layer, a first gate insulating layer, a gate electrode, a second gate insulating layer, an interlayer insulating layer, and a source-drain electrode layer on a base substrate, forming a first capacitor electrode of the storage capacitor in a same patterning process as the gate electrode, and forming a second capacitor electrode of the storage capacitor between the second gate insulating layer and the interlayer insulating layer.

In some examples, the plurality of first detection lines and the active layer are formed in the same patterning process.

Figure 6:
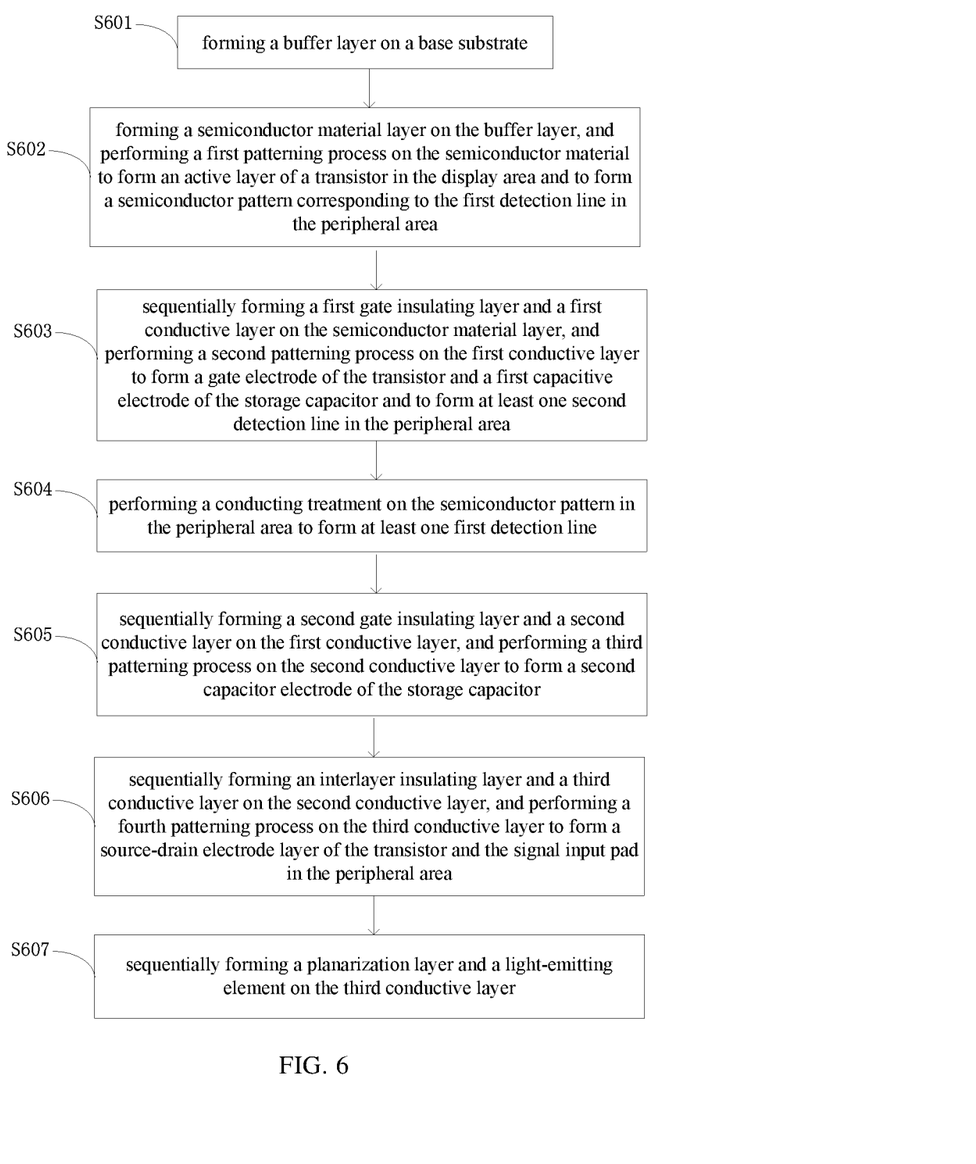
FIG. 6 is a flowchart of a method of manufacturing an electronic substrate provided by some embodiments of the present disclosure.

FIG. 6 is a flowchart of a method of manufacturing an electronic substrate provided by at least one embodiment of the present disclosure. The method of manufacturing the electronic substrate provided by this embodiment is described below with reference to FIGS. 1-2, 3A-3B, 4A-4B, and 6.

As illustrated in FIG. 6, the method comprises following steps S601-S607.

Step S601: forming a buffer layer 302 on a base substrate 301.

As illustrated in FIG. 1, the base substrate 301 comprises a display area 21, a peripheral area 22, and a detection area 23.

For example, the base substrate 301 may be a rigid substrate, such as a glass substrate, a silicon substrate, or a stainless steel substrate. The base substrate 301 may also be an organic flexible substrate, and for example, the material of the organic flexible substrate comprises polyimide (PI), polyethylene terephthalate (PET), polycarbonate, polyethylene, polyacrylate, polyether imide, polyethersulfone, and the like.

For example, the material of the buffer layer 302 may comprise an inorganic insulating material, such as an oxide of silicon like silicon oxide, silicon nitride or silicon oxynitride, nitride of silicon, or oxynitride of silicon, or a metal oxynitride insulating material such as aluminum oxide, titanium nitride or the like.

For example, the buffer layer 302 can be formed by using a chemical vapor deposition process or the like.

Step S602: forming a semiconductor material layer on the buffer layer, and performing a first patterning process on the semiconductor material to form an active layer of a transistor in the display area and to form a semiconductor pattern corresponding to the first detection line 231 in the peripheral area. For example, the semiconductor pattern further extends to the detection area 23 to be electrically connected to the detection circuit to be formed or provided in the detection area.

For example, the material of the semiconductor material layer may be a simple substance semiconductor material or a compound semiconductor material, and may comprise, for example, amorphous silicon, polycrystalline silicon (low-temperature polycrystalline silicon or high-temperature polycrystalline silicon), a metal oxide semiconductor (such as IGZO, AZO), and the like.

For example, the first patterning process may adopt a conventional photolithography process, which comprises steps of coating, exposing, developing, etching, and stripping of the photoresist, which are not described in detail herein.

Step S603: referring to FIGS. 3A, 3B and 4A, sequentially forming a first gate insulating layer 133 and a first conductive layer on the semiconductor material layer, and performing a second patterning process on the first conductive layer to form a gate electrode 122 of the transistor and a first capacitive electrode 202a of the storage capacitor 202 and to form the second detection line 232 in the peripheral area 22. The second detection line 232 further extends to the detection area 23. There is at least one first detection line 231 between every two second detection lines 232. As illustrated in FIG. 3B, the plurality of first detection lines 231 and the plurality of second detection lines 232 are alternately arranged one by one in a direction parallel to the surface of the base substrate 301.

For example, as illustrated in FIG. 3A, a data line lead-out line 221 may also be formed by performing the patterning process on the first conductive layer.

For example, the first gate insulating layer may be a single layer structure of silicon nitride or silicon oxide, or may be a multilayer structure formed by stacking silicon nitride and silicon oxide.

For example, the material of the first conductive layer comprises gold (Au), silver (Ag), copper (Cu), aluminum (Al), molybdenum (Mo), magnesium (Mg), tungsten (W), or an alloy material composed of the above metals, or may comprise a conductive metal oxide material, such as indium tin oxide (ITO), indium zinc oxide (IZO), zinc oxide (ZnO), zinc aluminum oxide (AZO), or the like.

For example, the first conductive layer may be formed by using sputtering, physical vapor deposition, chemical vapor deposition, or other processes.

For example, the second patterning process may adopt a conventional photolithography process, which comprises steps of coating, exposing, developing, etching, and stripping of the photoresist, which are not described in detail herein.

Step S604: performing a conducting treatment on the semiconductor pattern in the peripheral area to form at least one first detection line 231.

For example, the conducting treatment comprises doping treatment, and is achieved by doping the semiconductor pattern in the peripheral area.

For example, the doping can be achieved by using an ion implantation process. FIG. 7 is a schematic diagram of a conducting treatment by using an ion implantation process.

As illustrated in FIG. 7, the semiconductor material layer can be subjected to an ion-implanted treatment by virtue of a mask 310, so as to selectively dope the semiconductor material layer, and the mask 310 exposes a semiconductor pattern 231a that is used to form the first detection line. For example, in the case where the semiconductor material layer is made of a silicon material, the doping element may be a boron (B) element or a phosphorus (P) element.

For example, as illustrated in FIG. 7, the mask 310 may be a mask used for performing the first patterning process on the semiconductor material. In addition to exposing the semiconductor pattern 231a corresponding to the first detection line, the mask further exposes the active layer 121 of the transistor. Because the gate electrode 122 previously formed can shield the channel region of the active layer, plasma treatment may not affect the channel region, thereby saving the cost of the mask. For example, the ion implantation process also simultaneously dopes the source region and the drain region of the active layer to perform a conducting treatment on the source region and the drain region.

Step S605: sequentially forming a second gate insulating layer 134 and a second conductive layer on the first conductive layer, and performing a third patterning process on the second conductive layer to form a second capacitor electrode 202b of the storage capacitor.

For example, as illustrated in FIG. 3B, the data line lead-out line 221 may also be formed by performing the patterning process on the second conductive layer.

For example, a light-emitting control signal (EM) line (not illustrated) of the electronic substrate may also be formed by performing the patterning process on the second conductive layer.

In another example, as illustrated in FIG. 4B, the second detection line 132 may also be formed when performing the patterning process on the second conductive layer, that is, the second detection line 132 is formed in the same layer as the second capacitor electrode 202b.

Step S606: sequentially forming an interlayer insulating layer and a third conductive layer on the second conductive layer, and performing a fourth patterning process on the third conductive layer to form a source-drain electrode layer of the transistor, the data line 213, and the signal input pad 220 in the peripheral area.

A first power line 211 parallel to the data line 213 may also be formed by performing the patterning process on the third conductive layer.

Prior to the formation of the third conductive layer, the second gate insulating layer 314 and the interlayer insulating layer 315 are also etched to form via holes at positions corresponding to the data line lead-out lines 221, respectively, so as to facilitate electrical connection of the data lines and the corresponding data line lead-out lines 221.

As illustrated in FIG. 3A and FIG. 3B, prior to the formation of the third conductive layer, the first gate insulating layer 133, the second gate insulating layer 314, and the interlayer insulating layer 315 are also etched to form via holes (e.g., a first via hole 401 and a second via hole 402) corresponding to the active region and the drain region of the active layer and the region of the first detection lines and the second detection lines, so as to facilitate contact of the source electrode and drain electrode of the transistor with the active layer, and to facilitate the connection of the signal input pad and the data line lead-out line 221, the first detection line 231 and the second detection line 232, respectively. For example, the etching process may be a dry etching process or a wet etching process.

Step S607: sequentially forming a planarization layer and a light-emitting element on the third conductive layer.

For example, a planarization layer 170, a first electrode 127, a pixel defining layer 180, an organic light-emitting layer 128, and a second electrode 129 are sequentially formed on the third conductive layer.

For example, a via hole is formed in the planarization layer 170, so that the first electrode 127 and the drain electrode 124 of the driving transistor 201 can form an electrical connection through the via hole.

For example, the pixel defining layer 180 is subjected to a patterning process to form an opening, so as to define a light-emitting region, and the opening exposes at least part of the first electrode 127. Then, the organic light-emitting layer 128 and the second electrode 129 are sequentially formed corresponding to the opening, thereby forming the light-emitting element 203.

For example, the method further comprises providing a detection circuit in the detection area 23, such as a data line detection circuit 230. The detection circuit is electrically connected to the first detection lines and the second detection lines which extend to the peripheral area. For example, the detection circuit 230 may be formed on the base substrate 301 together with the device structure of the display area.

For example, the method further comprises detecting a signal line (such as a data line) corresponding to a detection line through the detection circuit, the first detection line and the second detection line.

For example, in the case where a defect (such as a short circuit or an open circuit) is found on the signal line through detection, the method may further comprise repairing the defective signal line.

For example, the method further comprises: cutting the first detection line and the second detection line along a cutting line 200 after the detection is completed to separate the detection area 23 from the peripheral area and the display area, so as to form an electronic substrate comprising the display area and the peripheral area and to form a first cutting surface of the first detection line 231, a second cutting surface of the second detection line 232, and a third cutting surface of the base substrate. For example, the cutting can be performed by using laser cutting or cutter wheel cutting.

For example, the method further comprises encapsulating the electronic substrate 20 after cutting to form an organic light-emitting diode display panel.

What are described above is related to the illustrative embodiments of the disclosure only and not limitative to the scope of the disclosure; and the scopes of the disclosure are defined by the accompanying claims.

What is claimed is:

1. An electronic substrate, comprising:
a base substrate, comprising a display area and a peripheral area outside the display area;
a plurality of sub-pixels in the display area;
a plurality of data lines in the display area, configured to provide data signals for the plurality of sub-pixels;
a plurality of signal input pads in the peripheral area, electrically connected to the plurality of data lines, respectively; and
a plurality of first detection lines and a plurality of second detection lines in the peripheral area and on a side of the plurality of signal input pads away from the display area, electrically connected to the plurality of signal input pads, respectively,
wherein the plurality of first detection lines are made of a non-metallic conductive material, the plurality of second detection lines are made of a metal conductive material, and at least one of the plurality of first detection lines is provided between every two adjacent second detection lines; and the electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

2. The electronic substrate according to claim 1, wherein the non-metallic conductive material is a semiconductor material which is subjected to a conducting treatment.

3. The electronic substrate according to claim 1, wherein the non-metallic conductive material comprises silicon or conductive metal oxide.

4. The electronic substrate according to claim 1, wherein the non-metallic conductive material comprises low-temperature polysilicon.

5. The electronic substrate according to claim 1, wherein at least one of the plurality of second detection lines comprises a second cutting surface, the second cutting surface is a second part of the cutting surface of the electronic substrate, and the second cutting surface is a cutting surface of the metal conductive material.

6. The electronic substrate according to claim 5, wherein the base substrate comprises a third cutting surface, the third cutting surface is a third part of the cutting surface of the electronic substrate, and the third cutting surface is on a side of the plurality of first detection lines and the plurality of second detection lines away from the display area, and is flush with the first cutting surface and the second cutting surface.

7. The electronic substrate according to claim 1, wherein at least one of the plurality of sub-pixels comprises a transistor and a storage capacitor;

the transistor comprises an active layer, a first gate insulating layer, a gate electrode, a second gate insulating layer, an interlayer insulating layer, and a source-drain electrode layer which are sequentially stacked on the base substrate, and the active layer is on a side of the gate electrode close to the base substrate; and the storage capacitor comprises a first capacitor electrode and a second capacitor electrode, the first capacitor electrode and the gate electrode are in a same layer, and the second capacitor electrode is between the second gate insulating layer and the interlayer insulating layer.

8. The electronic substrate according to claim 7, wherein the first detection lines and the active layer are in a same layer.

9. The electronic substrate according to claim 7, wherein the second detection lines and the first capacitor electrode are in a same layer, or the second detection lines and the second capacitor electrode are in a same layer.

10. The electronic substrate according to claim 7, wherein the plurality of signal input pads and the source-drain electrode layer are in a same layer.

11. The electronic substrate according to claim 1, wherein orthographic projections of the first detection lines on the base substrate and orthographic projections of the second detection lines on the base substrate are alternately arranged one by one.

12. A display panel, comprising an electronic substrate, wherein the electronic substrate comprises:

a base substrate, comprising a display area and a peripheral area outside the display area;

a plurality of sub-pixels in the display area;

a plurality of data lines in the display area, configured to provide data signals for the plurality of sub-pixels;

a plurality of signal input pads in the peripheral area, electrically connected to the plurality of data lines, respectively; and a plurality of first detection lines and a plurality of second detection lines in the peripheral area and on a side of the plurality of signal input pads away from the display area, electrically connected to the plurality of signal input pads, respectively, wherein the plurality of first detection lines are made of a non-metallic conductive material, the plurality of second detection lines are made of a metal conductive material, and at least one of the plurality of first detection lines is provided between every two adjacent second detection lines; and the electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

13. A method of manufacturing an electronic substrate, comprising:

forming a plurality of sub-pixels and a plurality of data lines in a display area on a base substrate, the plurality of data lines being configured to provide data signals for the plurality of sub-pixels;

forming a plurality of signal input pads in a peripheral area outside the display area on the base substrate, the plurality of signal input pads being electrically connected to the plurality of data lines, respectively; and forming a plurality of first detection lines and a plurality of second detection lines in the peripheral area, the plurality of first detection lines and the plurality of second detection lines being on a side of the plurality of signal input pads away from the display area and being electrically connected to the plurality of signal input pads, respectively, wherein the plurality of first detection lines are made of a non-metallic conductive material, the plurality of second detection lines are made of a metal conductive material, and at least one of the plurality of first detection lines is provided between every two adjacent second detection lines; and the electronic substrate comprises a cutting surface, at least one of the plurality of first detection lines comprises a first cutting surface, the first cutting surface is a first part of the cutting surface of the electronic substrate, and the first cutting surface is a cutting surface of the non-metallic conductive material.

14. The method according to claim 13, further comprising:

providing a detection circuit in a detection area outside the display area and the peripheral area, wherein the plurality of first detection lines and the plurality of second detection lines extend to the detection area to be electrically connected to the detection circuit; and detecting the plurality of data lines through the detection circuit, the plurality of first detection lines, and the plurality of second detection lines.

15. The method according to claim 14, further comprising:

cutting the first detection lines and the second detection lines to separate the detection area from the peripheral area and the display area and to form the first cutting surface.

16. The method according to claim 15, wherein the first detection lines and the second detection lines are cut to form a second cutting surface of at least one of the second detection lines, and the second cutting surface is a cutting surface of the metal conductive material.

17. The method according to claim 13, wherein forming the plurality of first detection lines comprises:
forming a semiconductor material layer, and performing a patterning process and a conducting treatment on the semiconductor material layer, so as to form the plurality of first detection lines.

18. The method according to claim 17, wherein the non-metallic conductive material comprises silicon or conductive metal oxide.

19. The method according to claim 17, wherein forming at least one of the plurality of sub-pixels comprises forming a transistor and a storage capacitor, and forming the transistor and the storage capacitor comprises:
sequentially forming an active layer, a first gate insulating layer, a gate electrode, a second gate insulating layer, a interlayer insulating layer, and a source-drain electrode layer on the base substrate; and
forming a first capacitor electrode of the storage capacitor in a same patterning process as the gate electrode, and forming a second capacitor electrode of the storage capacitor between the second gate insulating layer and the interlayer insulating layer.

20. The method according to claim 19, wherein the plurality of first detection lines and the active layer are formed in a same patterning process.

* * * * *